United States Patent
O'Brien

(10) Patent No.: US 7,200,187 B2
(45) Date of Patent: Apr. 3, 2007

(54) MODULATOR FOR DIGITAL AMPLIFIER

(76) Inventor: Thomas J. O'Brien, 692 Blue Mountain Lake, East Stroudsburg, PA (US) 18301

( * ) Notice: Subject to any disclaimer, the term of this patent is extended or adjusted under 35 U.S.C. 154(b) by 1037 days.

(21) Appl. No.: 10/205,569

(22) Filed: Jul. 25, 2002

(65) Prior Publication Data

US 2003/0031245 A1 Feb. 13, 2003

Related U.S. Application Data

(60) Provisional application No. 60/308,005, filed on Jul. 26, 2001.

(51) Int. Cl.
*H03K 9/00* (2006.01)

(52) U.S. Cl. ........................ 375/316; 320/145; 327/26; 327/31; 327/36; 332/109; 370/205; 370/212; 375/238

(58) Field of Classification Search ................ 375/238, 375/316; 327/37, 172; 84/736; 370/213; 348/536; 341/143
See application file for complete search history.

(56) References Cited

U.S. PATENT DOCUMENTS

| | | | |
|---|---|---|---|
| 4,179,625 A * | 12/1979 | Carter .................... | 327/37 |
| 4,390,849 A | 6/1983 | Miskin | |
| 4,403,197 A | 9/1983 | Swanson | |
| 4,884,486 A * | 12/1989 | McClish .................... | 84/736 |
| RE33,333 E | 9/1990 | Taylor, Jr. et al. | |
| 5,352,986 A | 10/1994 | Modgil et al. | |
| 5,631,592 A * | 5/1997 | Schwarz et al. ............ | 327/172 |
| 5,729,175 A | 3/1998 | Ferrer | |
| 5,777,512 A | 7/1998 | Tripathi et al. | |
| 5,901,176 A | 5/1999 | Lewison | |
| 5,959,501 A | 9/1999 | Chester et al. | |
| 5,974,089 A | 10/1999 | Tripathi et al. | |
| 6,107,875 A | 8/2000 | Pullen et al. | |
| 6,107,876 A | 8/2000 | O'Brien | |
| 6,111,532 A | 8/2000 | Hirano et al. | |
| 6,124,757 A | 9/2000 | Newey | |
| 6,229,390 B1 | 5/2001 | Delano et al. | |
| 6,262,632 B1 | 7/2001 | Corsi et al. | |
| 6,297,692 B1 | 10/2001 | Nielson | |
| 6,344,811 B1 | 2/2002 | Melanson | |
| 6,348,836 B2 | 2/2002 | Delano | |
| 6,366,970 B1 | 4/2002 | Wolff et al. | |

(Continued)

OTHER PUBLICATIONS

Omid Oliaei; Clock Jitter Noise Spectra in Continuous-Time Delta-Sigma Modulators; IEEE International Symposium on Circuits and Systems 1999; May 30-Jun. 2, 1999; pp. 192-195.*

(Continued)

*Primary Examiner*—Mohammed Ghayour
*Assistant Examiner*—Adolf DSouza
(74) *Attorney, Agent, or Firm*—RatnerPrestia

(57) ABSTRACT

A digital modulator for driving a digital amplifier. The digital modulator has a subtractor which receives a digital input signal. A filter amplifier receives the output of the filter amplifier and is tuned to an idle frequency of the digital modulator. The digital modulator includes a delay element and a digital comparator. The digital comparator receives the output from the filter and applies it to the delay element. A feedback loop couples the output of the delay element to the subtractor.

4 Claims, 8 Drawing Sheets

U.S. PATENT DOCUMENTS

| | | |
|---|---|---|
| 6,373,898 B1 | 4/2002 | Langer et al. |
| 6,396,933 B1 | 5/2002 | Jung et al. |
| 6,404,367 B1 | 6/2002 | Van der Zwan et al. |
| 6,414,560 B2 | 7/2002 | Delano |
| 6,414,613 B1 | 7/2002 | Midya et al. |
| 6,429,737 B1 | 8/2002 | O'Brien |
| 2001/0030577 A1 | 10/2001 | Stephens et al. |
| 2002/0033734 A1 | 3/2002 | Broadley |
| 2002/0036579 A1 | 3/2002 | Grosso et al. |
| 2002/0053945 A1 | 5/2002 | Putzeys |
| 2002/0057082 A1 | 5/2002 | Hwang |
| 2002/0070799 A1 | 6/2002 | Dahan et al. |
| 2002/0075068 A1 | 6/2002 | Hsu |
| 2002/0075069 A1 | 6/2002 | Karki et al. |
| 2002/0084843 A1 | 7/2002 | Ruha |

OTHER PUBLICATIONS

Klugbauer-Heilmeier, "A Sigma Delta Modulated Switching Power Amp" Audio Engineering Society, 92nd Convention, pp. 1-10, fig. 1-8, (Mar. 24-27, 1992), Preprint 3227, Vienna.

Klugbauer-Heilmeier, "A Sigma-Delta Power Amplifier for Digital Input Signals," Audio Engineering Society 102nd Convention, pp. 1-8, fig. 1-8, (Mar. 22-25, 1997), Preprint 4448, Munich, Germany.

Nielson, "Linearity and Efficiency Performance of Switching Audio Power Amplifier Outage Stages—A Fundamental Analysis," Audio Engineering Society 105th Convention, pp. 1-25, fig. 1-19, (Sep. 26-29, 1998) Preprint 4838, San Francisco, California.

van der Zee, et al. "A High Efficiency Class D+Class AB Audio Power Bridge Amplifier," Audio Engineering Society 105th Convention, pp. 1-8, fig. 1-12, (Sep. 26-29, 1998), Preprint 4777, San Francisco, California.

Floros et al., "A Distortion-Free PWM Coder For All-Digital Audio Amplifiers," Audio Engineering Society 110th Convention, pp. 1-4, (May 12-15, 2001), Convention Paper 5361, Amsterdam, The Netherlands.

O'Brien, "Digital Class-D Subwoofer Amp, Pt. 1," audioXpress, pp. 4, 26-33, vol. 32, No. 3 (Mar. 2001), Audio Amateur Corporation.

O'Brien, "Digital Class-D Subwoofer Amp, Pt. 2," audioXpress, pp. 4, 44-47, vol. 32, No. 4 (Apr. 2001), Audio Amateur Corporation.

Esslinger et al., "Digital Audio Power Amplifiers Using Sigma Delta Modulation Linearity Problems In The Class-D Power Stage," Audio Engineering Society 110th Convention, pp. 1-12 (May 12-15, 2001), Convention Paper 5400, Amsterdam, The Netherlands.

Berkhout, "Integrated Class D Amplifier," Audio Engineering Society 112th Convention, pp. 1-6, (May 10-13, 2002), Convention Paper 5502, Munich, Germany.

van der Hulst et al., "An Asynchronous Switching High-End Power Amplifier," Audio Engineering Society 112th Convention, pp. 1-7, (May 10-13, 2002), Convention Paper 5503, Munich, Germany.

R. Esslinger et al, "Distortions By Switching Errors In Digital Power Amplifiers Using Sigma Delta Coded Signals," Audio Engineering Society 112th Convention, pp. 1-14, (May 10-13, 2002), Convention Paper 5633, Munich, Germany.

R. Esslinger et al, "Sigma-Delta Modulation In Digital Class-D Power Amplifiers: Methods For Reducing The Effective Pulse Transition Rate," Audio Engineering Society 112th Convention, pp. 1-16, (May 10-13, 2002), Convention Paper 5634, Munich, Germany.

* cited by examiner

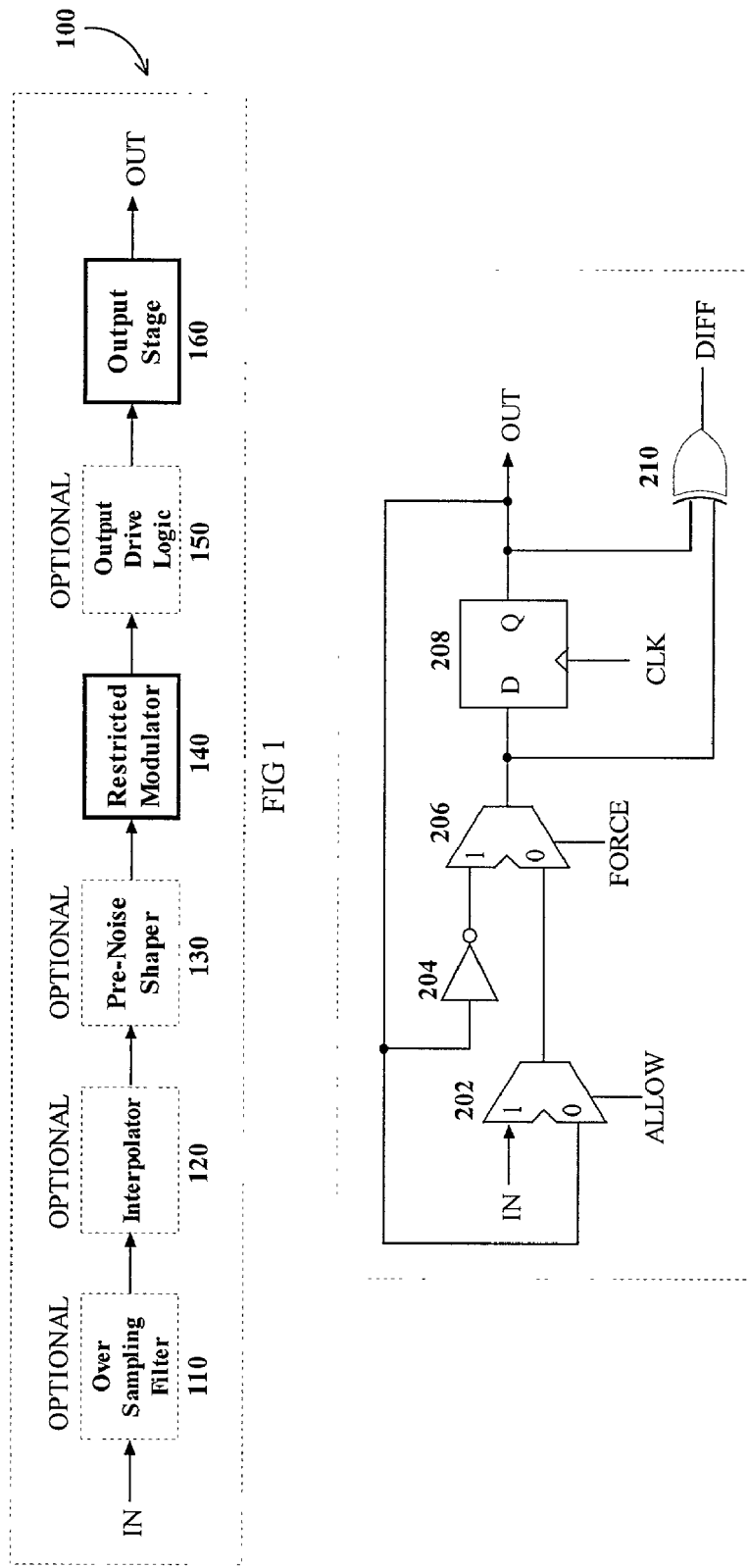

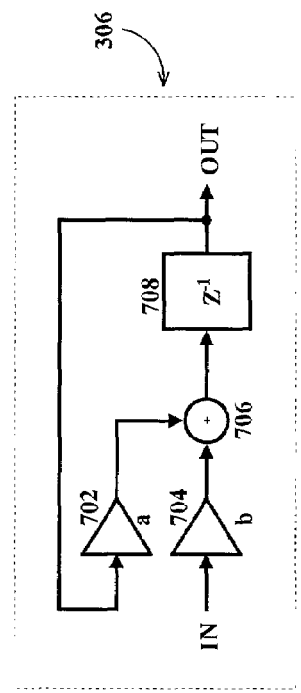
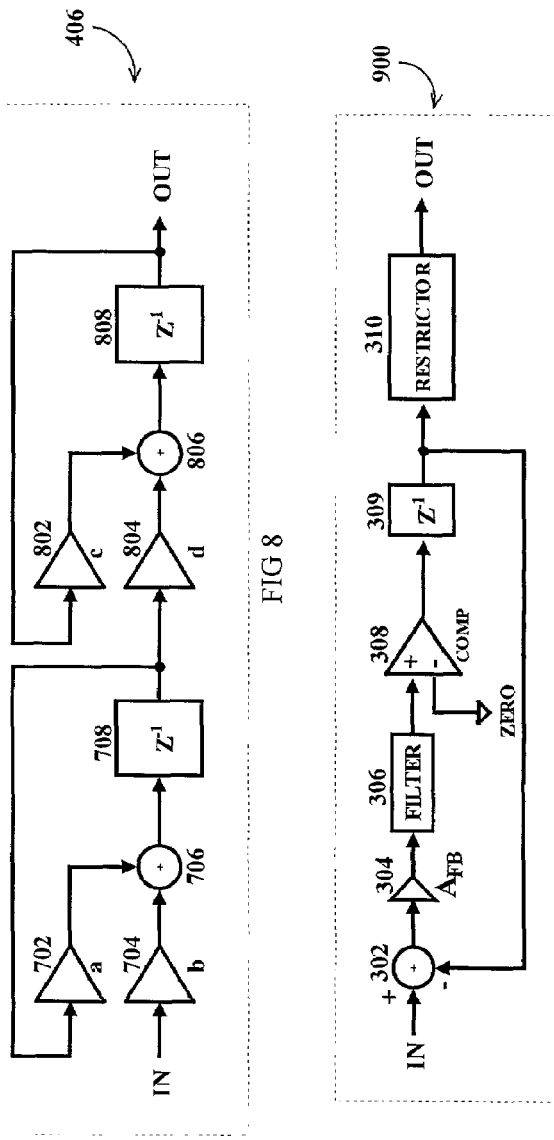
FIG 7
FIG 8
FIG 9

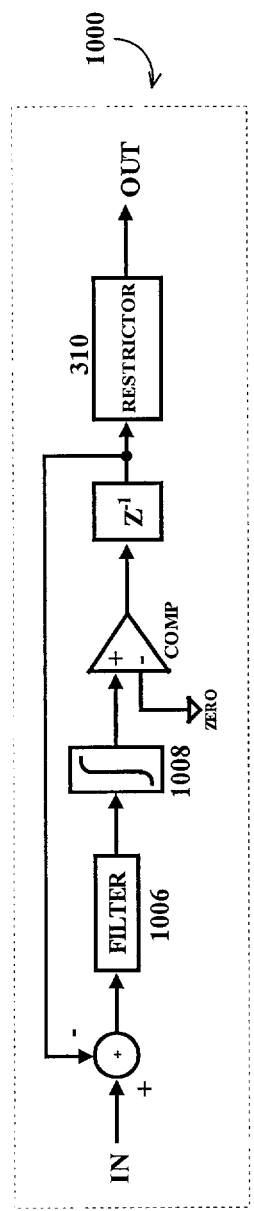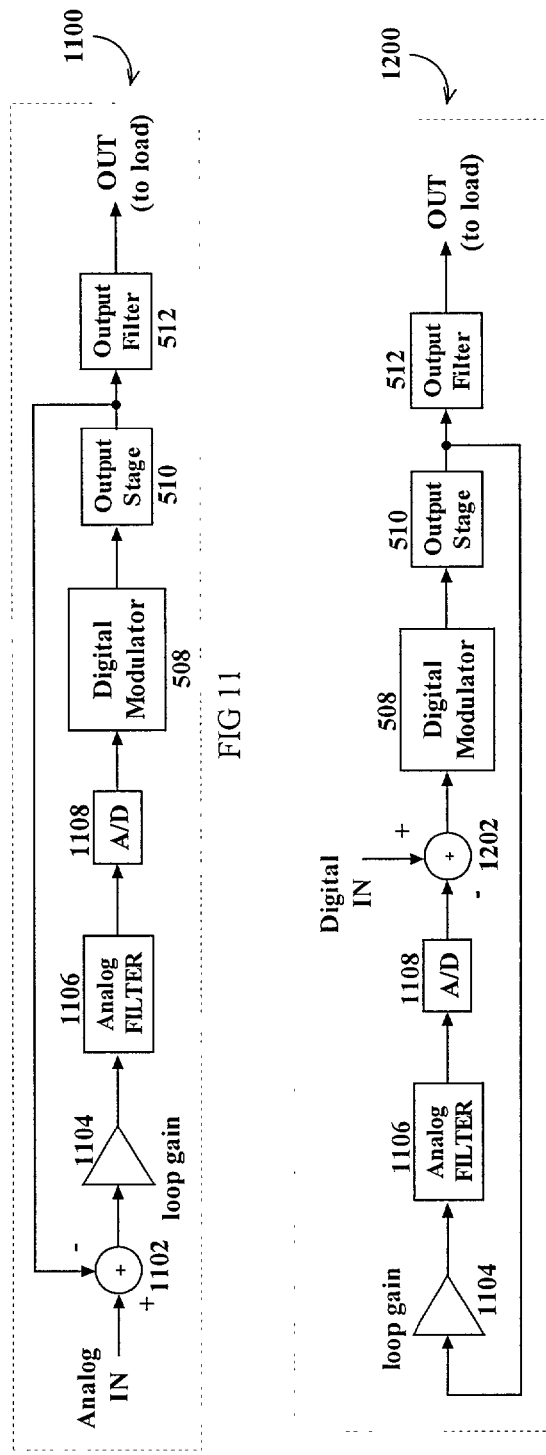

MODULATOR FOR DIGITAL AMPLIFIER

CROSS REFERENCE TO RELATED APPLICATION

This application claims the benefit under Title 35 U.S.C. § 119(e) of U.S. Provisional Application No. 60/308,005 filed on Jul. 26, 2001, the contents of which are incorporated by reference.

FIELD OF THE INVENTION

The present invention relates to digital amplifiers and particularly to a digital modulator including a restricted digital modulator, configured to drive a digital audio power amplifier.

BACKGROUND OF THE INVENTION

Pulse Width Modulation (PWM) models an analog input signal as a sequence of pulses having a fixed amplitude and period but having a variable pulse width. The time integral of the PWM signal closely approximates the analog input signal.

Many digital amplifiers and some analog amplifiers use PWM to convert incoming audio signals to a pulse train and then increase the amplitude of the pulse train in order to amplify the input signal. Analog PWM is performed by analog circuits that provide a continuously variable switching point. That is to say, the pulse widths of the pulses produced by an analog PWM system are continuously variable within the period of the switching signal. In digital PWM, however, the switching point varies in discrete steps defined by the sampling signal. Typically, the frequency of the sampling signal (the sampling frequency) is much greater than the frequency of the switching signal (the switching frequency). Because the pulse width may vary only in discrete steps, digital PWM signals suffer from quantization noise and may require noise shaping or dithering to reduce at least the apparent quantization noise. Multi-bit output noise shaping may be performed at the switching frequency. This, however, is a non-linear process because the input waveform changes after the modulator has determined the preferred output pulse width. To overcome the error associated with this process, a linearizer may be used, but the resulting complexity of the modulator greatly increases its cost.

Digital PWM also suffers from minimum and maximum pulse width limitations. In order to control an output stage accurately, the pulse width is desirably held to a minimum number of clock cycles. Otherwise, the output stage can not track the desired PWM output signal. These minimums ultimately limit the output power attainable with a given power supply voltage. Furthermore, pulses greater than the maximum pulse width may unduly burden the power supply or require excessive cooling of the output transistors.

There is therefore a need for a modulator for digital amplifiers that overcome the limitations associated with digital PWM-based amplifier systems.

SUMMARY OF THE INVENTION

The present invention is embodied in a digital modulator for driving a digital amplifier. The digital modulator has a subtractor which receives a digital input signal. The digital modulator also has a digital filter amplifier which is tuned to an idle frequency of the digital modulator. The digital modulator includes a delay element and a digital comparator. The digital comparator receives the output from the filter and applies the filtered output signal to the delay element. The delay element is coupled to the subtractor to provide a signal from the output of the delay element to the subtractor.

BRIEF DESCRIPTION OF THE DRAWINGS

FIG. 1 is a general block diagram of an embodiment of a digital amplifier system including a restricted modulator according to the present invention.

FIGS. 2A, 2B and 2C are logic diagrams of circuitry suitable for use as the modulator, including the restricted modulator, shown in FIG. 1.

FIG. 7 is a block diagram of a first order filter used in connection with embodiments of the invention.

FIG. 8 is a block diagram of a second order filter used in connection with embodiments of the invention.

FIG. 9 is a block diagram of an embodiment of the invention showing the restricted modulator outside the feedback loop.

FIG. 10 is a block diagram of an embodiment of the invention showing a second-order filter with the restricted modulator outside the feedback loop.

FIG. 11 is a block diagram of an embodiment of the invention which processes an analog input signal and has feedback taken between the output stage and the output filter.

FIG. 12 is a block diagram of an embodiment of the invention which processes a digital input signal and has feedback taken between the output stage and the output filter.

DESCRIPTION OF THE EXEMPLARY EMBODIMENTS

Figure 2B:
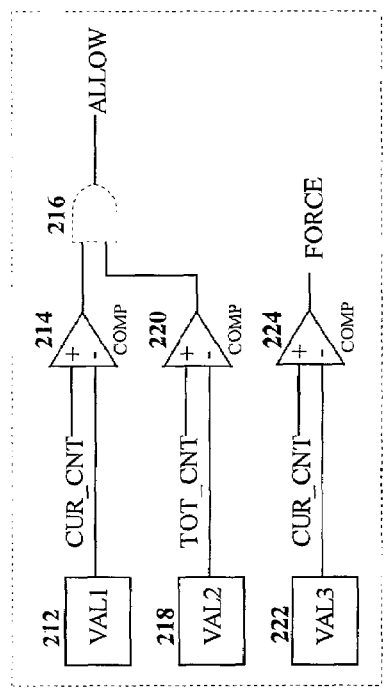

This invention is for use in digital amplifiers, including, but not limited to, digital audio power amplifiers. The modulation algorithms described herein avoid PWM by using a direct digital modulator technique in one embodiment, the invention effectively defines a variable switching frequency that overcomes many limitations associated with digital PWM-based amplifier systems.

FIG. 1 depicts an embodiment of an amplifier system 100 with a modulator 140 according to the present invention. The embodiment of amplifier system 100 shown in FIG. 1 has a number of optional elements 110, 120, 130, and 150 which may, or may not, be used as necessary to create various embodiments of the system. Optional processing blocks 110, 120, 130, and 150 can be used in other combinations than are shown in FIG. 1.

An input signal IN is applied to system 100 at the input port of optional over-sampling filter 110. The signal IN may be, for example, a digital bit-stream or a parallel pulse-code modulated (PCM) signal representing input data. As described below, with reference to one embodiment of the invention, the input signal IN may be the output signal of an analog sigma-delta modulator.

In one embodiment, the input signal may represent a signal in the audio frequency range, that is to say having frequency components less than about 20 KHz. A smaller range, 0–2 KHz, may be acceptable when the system is used for a subwoofer application.

As shown in FIG. 1, the signal IN may first be provided to over sampling filter 110 to increase the sample rate of the signal. The exemplary oversampling filter repeats each PCM sample multiple times to provide a PCM signal having a much-higher sampling rate than the input signal, IN. Thereafter, the oversampled the data may then be applied to an optional interpolator 120 which may smooth the transition among successive samples of the oversampled signal.

A multi-bit noise shaper, referred to as pre-noise shaper 130, may optionally be used to reduce the data word size, thereby converting the signal to a lower resolution. An example of pre-noise shaper 130 may be, for example, the noise shaper shown in U.S. Pat. No. 6,107,876 to O'Brien. Those skilled in the art will recognize that other pre-noise shapers may be used. Noise generated by the process up to pre-noise shaper 130 may be shifted up in frequency in order to make it easier to remove, for example, with a low-pass filter. In the exemplary embodiment of the invention, the pre-noise shaper 130 quantizes the input signal to a single bit to provide a bit-stream as its output signal.

The high rate bit-stream, which may be the input signal IN, or the output signal of any one of the oversampling filter 110, interpolator 120 or pre-noise shaper 130 is applied to restricted modulator 140 which converts the data stream to a digital serial bit stream. This serial bit stream is frequency limited to drive an output stage 160 within its operating limits, but does not employ a fixed-frequency switching signal. Output stage 160 provides an output signal, OUT, that drives a transducer (e.g. an audio speaker (not shown)) either directly or through a filter. It will be understood that output stage 160 may receive a two level binary or a multilevel signal.

As described in more detail below, restricted modulator 140 forces its output signal to conform to several criteria. The criteria are maximum switching frequency, minimum switching frequency, and minimum pulse width. Optional output drive logic 150 can be interposed between restricted modulator 140 and output stage 160. Output drive logic 150 conditions the output signal of the restricted modulator 140 to drive one or more power field effect transistors (FETs) An example of output drive logic 150 is the HIP2100 integrated circuit manufactured by Intersil Corporation. Those skilled in the art will recognize that other types of output drive logic may be used.

Figure 2C:
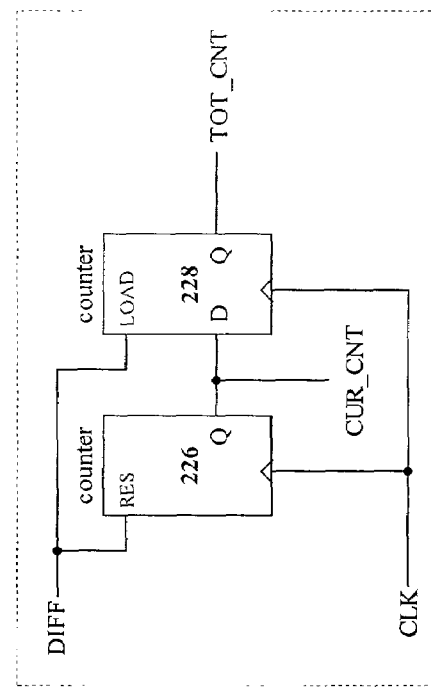

FIGS. 2A, 2B, and 2C are logic diagrams of circuitry suitable for use as the restricted modulator 140 shown in FIG. 1. In FIG. 2A, the signal IN is a serial bit-stream representing the input data. Input signal data received at IN is applied to one signal input terminal of a multiplexer 202. The other signal input terminal of the multiplexer 202 is coupled to receive a feedback signal, described below, provided by a flip-flop 208. The control input signal to the multiplexer is the signal ALLOW which is generated by the circuitry shown in FIG. 2B, described below. The output signal of the multiplexer 202 is coupled to one of the signal input terminals of the multiplexer 206. When the signal ALLOW is logic-high, the multiplexer 202 passes the signal IN to the multiplexer 206. When ALLOW is logic-low, the multiplexer 202 passes the feedback signal to multiplexer 206.

The other signal input terminal of multiplexer 206 is coupled to receive an inverted feedback signal from the output terminal of inverter 204. The control input terminal of multiplexer 206 is coupled to receive the signal FORCE, also provided by the circuitry shown in FIG. 2B. The output terminal of multiplexer 206 is coupled to the D input terminal of flip-flop 208 and to one input terminal of exclusive OR (XOR) gate 210. When the signal FORCE is logic-high, the output terminal of multiplexer 206 provides the inverted feedback signal from inverter 204 to flip-flop 208 and XOR gate 210. When FORCE is logic-low, the output terminal in multiplexer 206 provides the output signal of the multiplexer 202 to flip-flop 208 and XOR gate 210.

Flip-flop 208 is a conventional D-type flip-flop. In addition to its D input terminal, the flip-flop has a clock input terminal coupled to receive the clock signal CLK and an output terminal, Q, that provides the output signal out of the restricted modulator. Output signal OUT is also the feedback signal. The output terminal of flip-flop 208 is also coupled to the second input terminal of XOR gate 210. The output signal of the XOR gate 210 is the signal DIFF. This signal is logic-high when the signal applied to the input terminal D of flip-flop 208 has a different logic value than the output signal Q provided by the flip-flop (e.g. when the signal IN changes state). Otherwise, the signal DIFF is logic low. In the exemplary embodiment of the invention, the clock signal CLK is roughly equivalent to the sampling signal of a PWM and has a fixed frequency that may be in the range of 20 to 200 MHz. While the multiplexers 202 and 206 are shown as separate devices, it is contemplated that they may be implemented as a single three-input device that is responsive to a two-bit control signal generated by concatenating the signals ALLOW and FORCE.

The signal DIFF from the XOR gate 210 is applied to the reset input terminal, RES, of counter 226 and to the LOAD input terminal of counter 228, shown in FIG. 2C. Each of the counters 226 and 228 may be, for example, a conventional 8-bit counter and each has a clock input terminal coupled to receive the clock signal CLK and to increment their count values by one in response to each pulse of the clock signal. The output terminal of counter 226 is the signal CUR_CNT, described below, and is coupled to the input terminal of counter 228. The output signal of counter 228 is the signal TOT_CNT, also described below.

As described above, the signal DIFF is logic-high when the signal IN changes state, either from logic-low to logic-high or from logic-high to logic-low. When the signal DIFF transitions from logic-low to logic-high, counter 228 loads the current output value of counter 226 as its count value and counter 226 is reset to zero. Thus, the count value of counter 226, the signal CUR_CNT, represents the number of clock pulses since the last state change of the signal IN and the count value of counter 228, the signal TOT_CNT, represents the sum of the current value and previous value in counter 226. Thus, the value in counter 228 represents the number of clock pulses since the next-to-last transition of the signal IN. As described below, the signal CUR_CNT represents the pulse width of the current pulse of the signal IN and TOT_CNT represents the period of the current pulse.

In FIG. 2B, registers 212, 218 and 222 provide reference values VAL 1, VAL 2, and VAL 3, respectively. These values provide the criteria under which the exemplary modulator operates. More specifically, registers 212, 218, and 222 each holds a preset value to provide a reference value to a respective one of the comparators 214, 220, and 224. The value VAL 1 supplied by register 212 is the minimum number of clock cycles for the current pulse width of the signal IN. In one embodiment, the value VAL 1 held by register 212 is 8. This value is supplied to the reference input port of comparator 214. The other input port of comparator 214 is the signal CUR_CNT, a measure of the pulse width of the current pulse of the signal IN.

The value VAL 2 is applied to the reference input port of comparator 220, the other input port of which is coupled to receive the signal TOT_CNT. The value VAL 2 is the minimum period of the signal IN. This is, in effect, a maximum switching frequency for the restricted modulator 140. In the same exemplary embodiment as described above, the value VAL 2 is 128.

The output signals of the comparators 214 and 220 are coupled to respectively different input terminals of an AND gate 216. When both VAL 1 and VAL 2 are less than CUR_CNT, the output signal ALLOW, of the AND gate 216 is logic-high. If, however, either of these values becomes greater than CUR_CNT, ALLOW becomes logic-low. Thus, immediately after a state change of the signal IN, CUR_CNT is zero and ALLOW is held logic-low until CUR_CNT increments to a value greater than VAL 1. Similarly, after the same transition, if the previous value of CUR_CNT plus the current value of CUR_CNT (i.e. the current value of TOT_CNT) is less than VAL 2, the signal ALLOW is held logic low until counter 228 increments to a value greater than VAL 2. Because, when ALLOW is logic-low, multiplexer 202 passes the feedback signal, which is the current output signal of the flip-flop 208, the state of the output signal OUT remains the same regardless of any change in the state of the signal IN.

The value VAL 3 held by register 222 is the maximum number of clock cycles in a single state. This value is supplied to the reference input port of comparator 224. The other input port of comparator 224 is coupled to receive the signal CUR_CNT, the output signal of counter 226. The output signal of comparator 224 is the signal FORCE. As long as the value of the signal CUR_CNT is less than VAL 3, the signal FORCE remains logic low. If, however, CUR_CNT becomes greater than VAL 3, Then FORCE becomes logic-high. When FORCE is logic-high, multiplexer 206 passes the inverted feedback signal. Thus, the signal FORCE forces a change in the state of the output signal OUT, regardless of the current state of the signal IN.

The restricted modulator described with reference to FIGS. 2A, 2B and 2C has a higher bandwidth than a typical digital PWM. Tracking the input waveform at a much higher frequency permits the modulator to function faster as compared to digital PWM. Moreover, the restricted modulator 140 is a relatively simple circuit and, thus, is a low-cost easily implemented modulator.

Figure 3A:
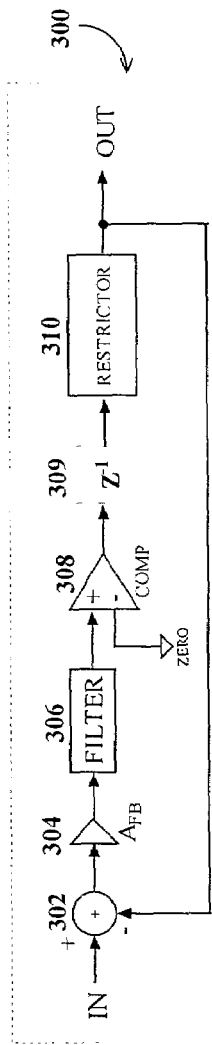
FIG. 3A is a block diagram of a first order digital modulator according to the present invention which uses the restricted modulator shown in FIGS. 2A, 2B and 2C.

FIG. 3A shows an embodiment of a first order digital modulator 300 using the restrictor modulator described in FIG. 2. A one-bit digital input signal IN is applied to system 300 at the input port of subtractor 302. The output of subtractor 302 is inputted to filter amplifier 304. The output signal of filter amplifier 304 is applied to filter 306 which may be in the form shown in FIG. 7 and described below. The output signal of filter 306 is provided to comparator 308, the output of which is −1 and +1. It is understood, however, an output range of 0 and 1 would be acceptable. The output signal of comparator 308 is applied to delay element 309, the output of which is applied to a restrictor modulator 310 which may be the same as the restrictor modulator described above with reference to FIG. 2. Delay element 309 is synchronized to the clock. The output of restrictor modulator 310 is connected via a feedback loop to subtractor 302. The first order modulator 300 shown in FIG. 3A corrects first order errors in the modulated signal.

FIG. 7 is an embodiment of an exemplary circuit that may be used as the filter 306 in FIG. 3. This embodiment takes a multi-bit digital input signal and produces a one-bit digital output signal. In FIG. 7, the signal IN represents the input digital signal from filter amplifier 304 in FIG. 3A and the signal out OUT represents the output signal from filter 306 in FIG. 3A. The signal IN in FIG. 7 is applied to a scaler 704. In an exemplary embodiment, scaler 704 may multiply the signal IN by a factor, b. The digital output signal from scaler 704 is provided to adder 706, the output signal of which is applied to the input port of a delay element 708. The output signal of delay element 708 provides the output signal, OUT, of the filter and is also applied to the input port of scaler 702 via a feedback loop. In one exemplary embodiment, the scaler 702 multiplies the feedback signal by a factor, b. The output signal of scaler 702 is applied to another input port of adder 706. In the exemplary embodiment of the inventions, the factors a and b are related such that a+b=1. Thus, the filter exhibits a unity gain. Exemplary values for a and b are: a=(1−1/x) and b=1/x, where x is typically a power of two, for example, x=64 or x=128. The exemplary filter is a low-pass filter having a corner frequency that conforms to the expression $Fs/(2\pi x)$ where Fs is the clock frequency. As set forth above, the clock frequency is typically in the range of 20 to 200 MHz.

The loop filters in the described embodiments of the invention act to stabilize the modulators. Any modulator that includes feedback has a frequency at which it will oscillate. This frequency is known as a pole in the transfer function of the modulator. The frequency response characteristic of the loop filter is set such that frequencies at or near the frequency of the pole are strongly attenuated. This tends to prevent oscillations from developing in the feedback loop. By keeping the design simple, the dominant pole may be positioned well outside of the desired operational frequency range of the modulator. Thus, the loop filter may be designed to attenuate signals at the pole frequency while not significantly affecting the frequency response characteristic of the modulator for signals in the 0 to 20 KHz audio range.

Figure 3B:
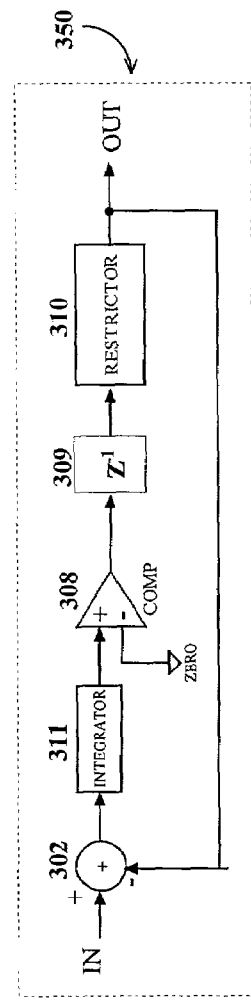
FIG. 3B is a block diagram of another embodiment of a first order digital modulator according to the subject invention.
Figure 6:
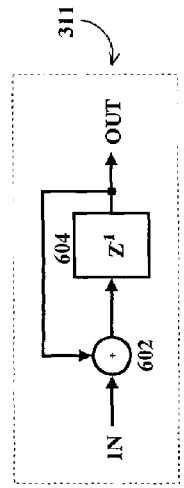
FIG. 6 is a block diagram of an integrator used in connection with embodiments of the invention.

Another embodiment of a first order modulator 350 using the restrictor modulator described in FIG. 2, is shown in FIG. 3B. Similar to the embodiment shown in FIG. 3A, this embodiment has a subtractor 302, a comparator 308, a delay element 309, and a restrictor modulator 310. However, instead of filter amplifier 304 and first order filter 306, first order modulator 350 in FIG. 3B uses an integrator 311. Integrator 311 is shown in more detail in FIG. 6. Signal IN in FIG. 6, is the signal coming from subtractor 302 in FIG. 3B. The output signal OUT in FIG. 6 is provided to comparator 308 in FIG. 3B. As shown in FIG. 6, integrator 311 comprises an adder 602 and a delay element 604, the output signal of which becomes the second input to adder 602 via a feedback loop. The embodiment of the first order restricted modulator shown in FIG. 3B also corrects first order errors in the modulated signal.

Figure 4A:
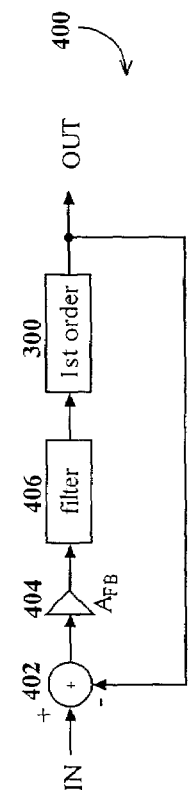
FIG. 4A is a block diagram of an embodiment of a second order digital modulator according to the subject invention.

FIG. 4A shows an embodiment of a second order modulator 400 which uses, as one of its components, the first order modulator 300 described in FIG. 3A. A one-bit digital input signal IN is applied to system 400 at the input port of subtractor 402. The output port of subtractor 402 is applied to filter amplifier 404. The output signal of filter amplifier 404 is provided to filter 406 which may be in the form shown in FIG. 7, described above. The output signal of filter 406 is applied to a first order modulator 300 which may the same as the first order modulator 300 described with reference to FIG. 3A. The output signal of first order modulator 300 is connected via a feedback loop to subtractor 402. The second order modulator 400 shown in FIG. 4A corrects second order errors in the digitally modulated output signal.

FIG. 8 is an embodiment of a two tap, second order filter, suitable for use as the filter 406 shown in FIG. 4A. It comprises two feedback circuits which are similar in configuration to the feedback circuit shown in FIG. 7, with identical elements being identified by the same reference numbers 702, 704, 706, 708 as shown in FIG. 7. Elements 702, 704 in FIG. 8 have the same gain as elements 702, 704 in FIG. 7. In FIG. 8, the output signal of delay element 708 is applied to scaler 804 which multiplies the signal by a factor, d. Scaler 804 provides one input signal to subtractor 806, and the output of subtractor 806 is coupled to delay element 808. The output signal out of delay element 808 is, in turn, coupled to the input port of first order modulator 300 in FIG. 4A. This signal is also applied to the second input port of subtractor 806 via a feedback loop including scaler 802, which multiplies the signal by a factor, c. The factors c and d of scalers 802 and 804 may be the same as the respective factors a and b of the filter described above with reference to FIG. 7. The use of two filters may be desirable because of the increased attenuation of the poles in the transfer function of the modulator.

Figure 4B:
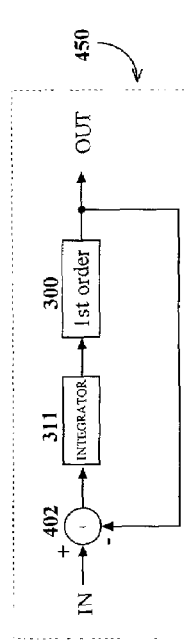
FIG. 4B is a block diagram of another embodiment of a second order digital modulator according to the subject invention.
Figure 5A:
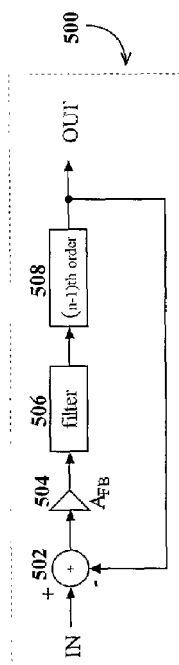
FIG. 5A is a block diagram of an embodiment of an $n^{th}$ order digital modulator according to the subject invention.
Figure 5B:
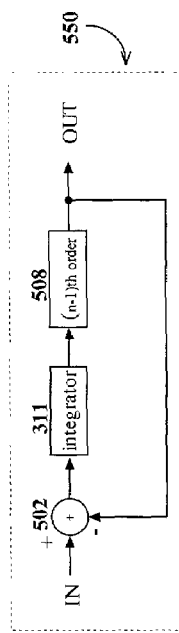
FIG. 5B is a block diagram of another embodiment of an $n^{th}$ order digital modulator according to the subject invention.

Another embodiment of a second order modulator 450 is shown in FIG. 4B. Similar to the embodiment shown in FIG. 4A, this embodiment has a subtractor 402 and a first order modulator 300. However, instead of filter amplifier 404 and filter 406, second order modulator 450 in FIG. 4B uses the integrator 311 shown in more detail in FIG. 6. The embodiment of the second order modulator shown in FIG. 4B also corrects second order errors in the output signal. The modulators shown in FIGS. 4A and 4B are second-order modulators because they include nested embodiments of the first-order modulator shown in FIGS. 3A and 3B. This nested structure may be extended to build an nth order modulator, as shown in FIGS. 5A and 5B. In an $n^{th}$ order modulator, subtractor 502 and filter amplifier 504 are connected in series and to filter 506 in the same manner and perform the same functions as described with respect to like elements in FIGS. 3 and 4. Filter 506 may be a first-order filter, as described above with reference to FIG. 7. Element 508 in FIG. 5A is an $(n-1)^{st}$ modulator consisting of n-1 nested modulators 300 configured in the same way as the two modulators shown in FIG. 4A. The resulting circuit is the nth order modulator 500.

Similarly, FIG. 5B shown an alternative embodiment of an $n^{th}$ order modulator, except that integrator 311 is substituted for filter 506. While the modulators are described above as using either filters or integrators, it is contemplated that modulators using filters may be nested with modulators using integrators and vice-versa.

FIG. 9 shows another embodiment 900 of the restricted modulator and is a modification of the first order modulator shown in FIG. 3A. The only difference between the embodiment 300 shown in FIG. 3A and the embodiment 900 shown in FIG. 9 is that in FIG. 9, the restrictor 310 is outside the modulation loop. Otherwise the items shown in FIG. 9 operate in the same way as the corresponding items in FIG. 3A. An advantage of placing the restrictor 310 outside the modulation loop is that the switching introduced by the restrictor to conform the output signal to the output stage (not shown) is not included in the feedback signal.

FIG. 10 is another embodiment of a second order modulator 1000. This embodiment includes both a filter 1006 and an integrator 1008 wherein the filter drives the integrator in a single loop. This embodiment performs second order filtering by the cascade combination of the filter 1006 and integrator 1008. The filter 1006 may be the filter shown in FIG. 7 and the integrator 1008 may be the same as shown in FIG. 6.

FIG. 11 is an embodiment of the modulator 1100 when the input signal IN is an analog signal, rather than a digital signal. The signal IN is applied to summing element 1102, the output signal of which is provided to the cascade connection of amplifier 1104, analog loop filter 1106, and A/D (analog to digital) converter 1108. The output signal of A/D converter 1108 is applied to a digital modulator 508, which may be, for example, any of the modulators shown in FIGS. 3A through 5B, 9 and 10. The output terminal of digital modulator 508 is coupled to output stage 510 which provides an analog output signal to output filter 512. Output stage 510 also provides the feedback signal to the summing element 1102. Summing element 1102 compensates for the difference in gain between the input signal IN and the signal provided by the output stage 510. Thus, in this embodiment of the invention, the output stage performs the digital-to-analog conversion operation. Although not shown in FIG. 11, it is contemplated that the output filter 512 may provide the feedback signal instead of the output stage 510. In yet another alternative embodiment, both the output stage and the output filter may provide feedback signals. These signals are summed with the input signal in the summing junction 1102. Because this structure introduces multiple feedback paths, however, it may complicate the design of the analog loop filter 1106.

FIG. 12 shows yet another alternative embodiment 1200. In this embodiment, a digital input signal is applied to the IN port of subtractor 1202. The remaining elements between subtractor 1202 and the output signal OUT are configured and operate the same as the same elements in FIG. 11. In the embodiment shown in FIG. 12, however, the feedback loop feeds the signal from output stage 510 to loop gain amplifier 1104, which attenuates the signal to conform to the levels of the input signal IN, and applies the attenuated signal to the cascade combination of analog filter 1106 and A/D converter 1108. The output signal of the analog-to-digital converter is the second input signal to subtractor 1202. As described above with reference to FIG. 11, in an alternative embodiment, the feedback loop can be taken after output filter 512. In yet another alternative embodiment, both the output stage 510 and the output filter 512 may provide feedback signals which are summed (not shown) before being applied to the loop gain circuitry 1104. In yet another embodiment, the digital input signal to subtractor 1202 may be filtered and adjusted for gain before being applied to the input port of subtractor 1202.

Figure 13:
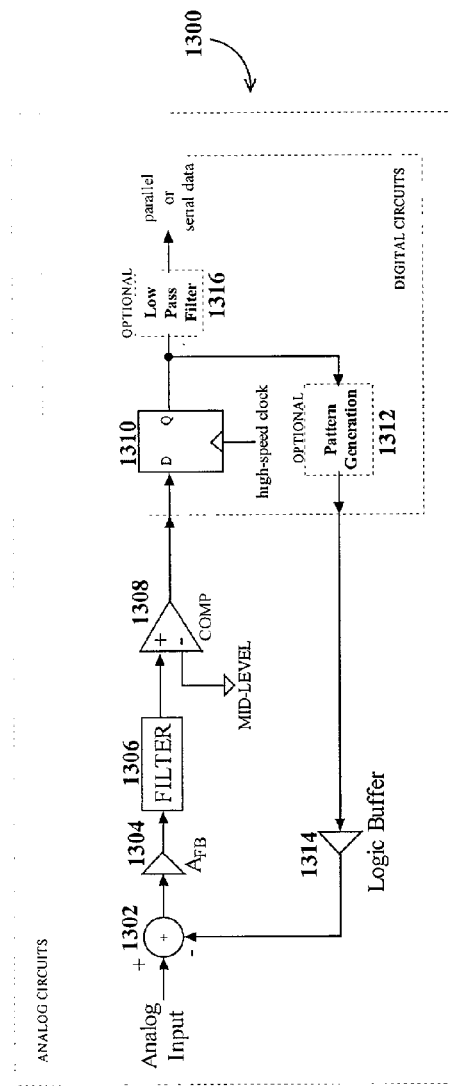
FIG. 13 is a block diagram of an embodiment of a filter-based first order analog to digital converter used to supply an input to the restricted modulator.

As described above in connection with FIGS. 1 to 5, the input signal IN may be, for example, the output signal generated by an analog sigma-delta modulator. An embodiment 1300 of such an analog sigma-delta modulator is shown in FIG. 13. Typically, analog sigma-delta modulators are used as a component in a sigma-delta analog-to-digital converter. In this embodiment of the invention, the sigma-delta modulator is used to generate a one-bit sampled signal, having digital signal levels, which is applied to the subtractors 302, 402 or 502 of the modulators shown in FIGS. 3A through 5B.

In FIG. 13, an analog input signal is applied to the input port of summing element 1302, the output signal of which is coupled to the cascade combination of filter amplifier 1304 and filter 1306. The filter 1306 may, for example, have the same structure as filter 306, shown in FIG. 7. The output signal of filter 1306 is coupled to comparator 1308 which operates in the same way as comparator 308 in FIG. 3A. In each of these embodiments, the output signal of the filter may range, for example, between +1v and −1v and the reference level of the comparator is set to 0v. It is understood, however, that an output range of 0 and 1 would be acceptable. The output signal of comparator 1308 is applied to flip-flop 1310, a conventional D-type flip-flop which has a D input terminal and an input terminal coupled to receive a high-speed clock signal and an output terminal, Q, that provides a bit-serial output signal through optional low pass filter 1316.

The output signal of flip-flop 1310 is also provided to summing element 1302 through a feedback loop including logic buffer 1314 which, in the exemplary embodiment of the invention, acts as a digital to analog (D/A) converter. Logic buffer 1314 cleans up the digital signal by removing digital artifacts such as level variations and ringing on transition edges. An exemplary logic buffer 1310 is the NC7S04 (single "tiny logic" inverter) from Fairchild Semiconductor. The feedback loop may optionally include pattern generator 1312 which provides a non-return to zero (NRZ) type output providing, for example, one pulse width for logic-high and another pulse width for logic-low. Pattern generator 1312 makes sure that the output from flip-flop 1310 is continuously toggled.

At the summing element 1302, the converted feedback signal is subtracted from the analog input signal. The subtracted signal is the difference signal or error signal. The difference signal is amplified by filter amplifier 1304 and filtered by filter 1306. The amplified and filtered difference signal drives analog comparator 1308. Comparator 1308 compares its input to a reference value, outputs a digital value, and drives the digital section of the A/D converter in logic buffer 1314.

It will be understood that the A/D converter in FIG. 13 can also be an analog version of the digital modulator shown in FIG. 2.

Figure 14:
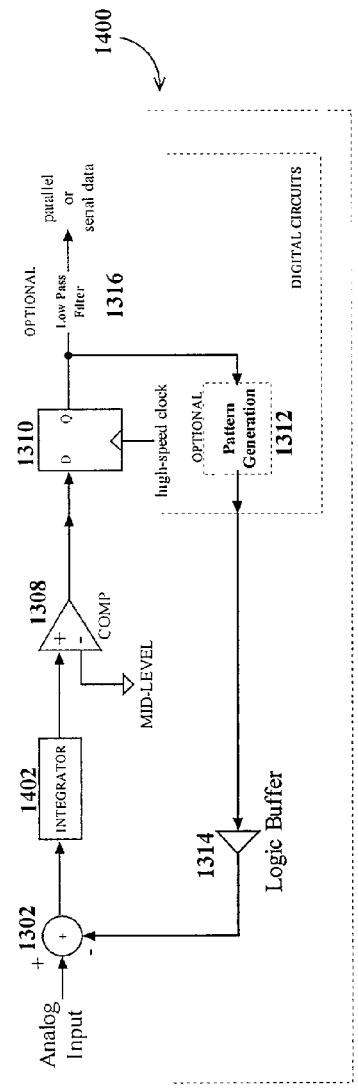
FIG. 14 is a block diagram of an embodiment of an integrator-based analog to digital converter used to supply an input to the restricted modulator.

FIG. 14 is another embodiment 1400 of an analog to digital converter. The only difference between the embodiments in FIGS. 13 and 14 is the substitution of integrator 1402 for filter amplifier 1304 and filter 1306 in FIG. 13. Integrator 1402 may be in the form shown in FIG. 6.

Figure 15:
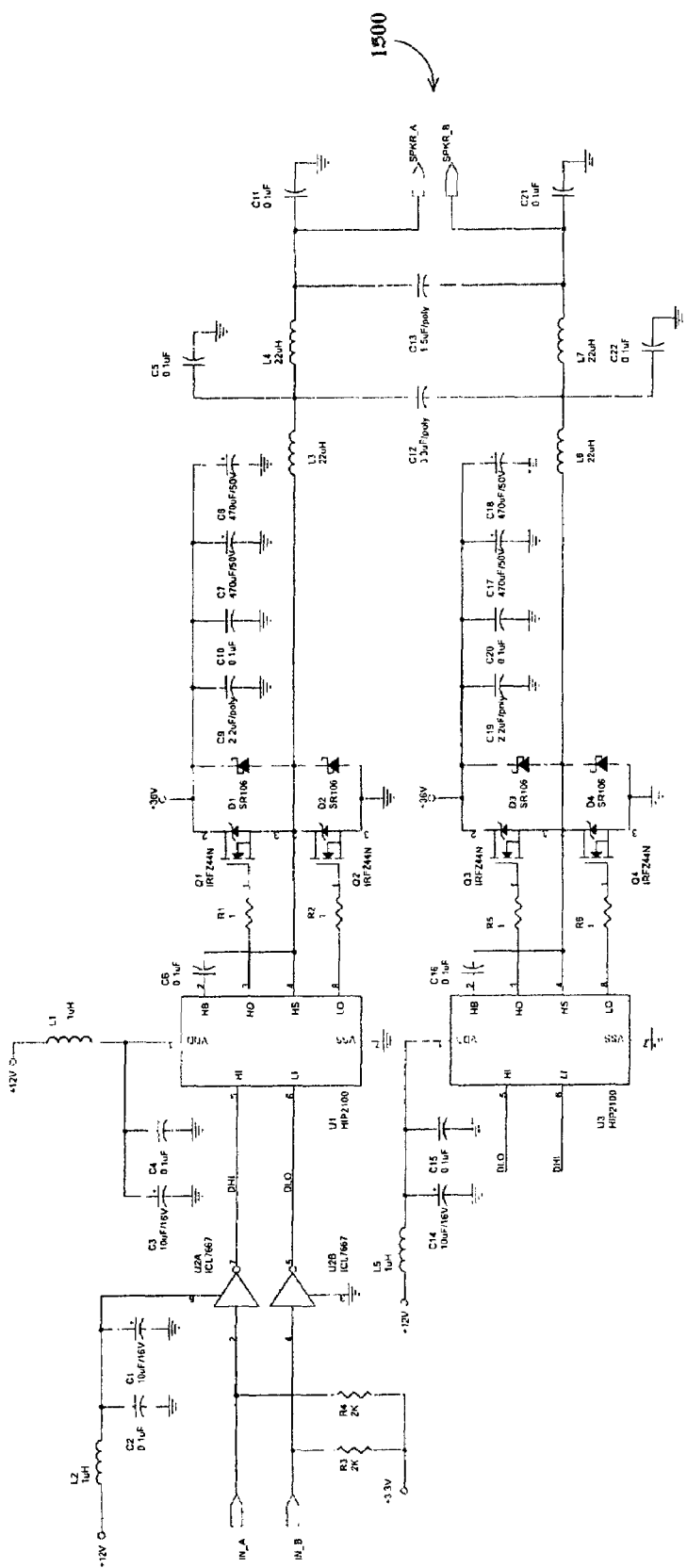
FIG. 15 is schematic diagram of circuitry suitable for use as the output stage of a digital amplifier according to the present invention.

As described above with reference to FIGS. 1 to 5, the output signal of the restricted modulator is fed to an output stage which drives the transducer (e.g. one or more an audio speakers) (not shown). An embodiment of such an output stage is shown in FIG. 15. FIG. 15 shows circuitry 1500 designed to drive a transducer load in a digital amplifier system. The elements of circuitry 1500 are shown in FIG. 15.

It is understood that the present invention is susceptible to many different variations and combinations and is not limited to the specific embodiments shown in this application. Accordingly, it is understood that the above description of the embodiments of the invention are susceptible to considerable modifications, changes, and adaptations by those skilled in the art and that such modifications, changes and adaptations are intended to be considered within the scope of the present invention, which is set forth by the appended claims.

The invention claimed is:

1. A restricted modulation method comprising the steps of:
   receiving an input signal that alternates between first and second states;
   storing the input signal and providing the stored input signal as an output signal;
   generating a first ramp signal responsive to the input signal and comparing the first ramp signal to a first threshold value and to a second threshold value, the first threshold value and the second threshold value associated with a pulse width of the input signal;
   generating a second ramp signal responsive to the input signal and comparing the second ramp signal to a third threshold value associated with a pulse period of the input signal;
   substituting the output signal for the input signal if the first ramp signal is less than the first threshold value or if the second ramp signal is less than the third threshold value; and
   substituting an inverted output signal for the input signal if the first ramp signal is greater than the second threshold value.

2. A restricted modulator comprising:
   a terminal which is configured to receive an input signal that alternates between first and second states;
   a delay element which stores the input signal and provides the stored input signal as an output signal;
   first arid second counters which count pulses of a clock signal to measure a) an amount of time for each state in the input signal to provide a pulse width value and b) an amount of time between successive changes from one of the first and second states to the other one of the first and second states to provide a pulse period value;
   a multiplexer that substitutes the output signal for the input signal if the pulse width value is less than a first predetermined value or if the pulse period value is less than a second predetermined value and that substitutes an inverted output signal for the input signal if the pulse width value is greater than a third predetermined value.

3. A restricted modulator coupled to receive an input signal and to provide a modulated output signal, the restricted modulator comprising:
   a first multiplexer having an output port, a first signal input port coupled to receive the input signal of the restricted modulator and a second signal input port coupled to receive the output signal, wherein the first multiplexer is responsive to a first control signal for selectively coupling the output port to one of the first and second input ports;
   a second multiplexer, having an output port, a first input port coupled to receive an inverted version of the output signal of the modulator and a second input port coupled to the output port of the first multiplexer, wherein the second multiplexer is responsive to a second control signal for selectively coupling the output port of the second multiplexer to one of the first and second input ports of the second multiplexer;

a delay element, having a clock signal input port, a signal input port coupled to the output port of the second multiplexer and an output port which provides the output signal of the restricted modulator;

circuitry, coupled to the delay element for providing a difference pulse signal when a signal applied to the input port of the delay element differs from the output signal of the modulator;

a first counter, coupled to receive the clock signal and the difference pulse signal for generating a count value equal to a number of pulses of the clock signal between successive pulses of the difference pulse signal;

a second counter, coupled to receive the clock signal and the count value provided by the first counter, for loading the count value from the first counter responsive to a pulse of the difference signal and for incrementing its count value by one for each pulse of the clock signal until a next pulse of the difference signal;

reference circuitry coupled to receive the count value and the incremented count value for generating the first and second control signals, the first control signal being generated when the count value is less than a first reference value or when the incremented count value is less than a second reference value and the second control signal being generated when the count value is greater than a third predetermined value.

4. A digital modulator coupled to receive a digital input signal for driving a digital amplifier, the modulator comprising:

a subtractor having a first signal input port coupled to receive the digital input signal, a second signal input port coupled to receive a feedback signal, and an output port;

a digital filter amplifier having an input port coupled to the output port of the subtracter and an output port, the filter being tuned to an idle frequency of the digital modulator;

a delay element;

a digital comparator for receiving the filtered output of the filter and for applying the filtered output signal to the delay element, the delay element being coupled to the subtractor for providing a signal from the output of the delay element to the second input port of the subtracter; and a restricted modulator comprising:

means for receiving the delayed output of the delay element as a restricted modulator input signal, the restricted modulator input signal alternating between first arid second states, means for storing the restricted modulator input signal and providing the stored input signal as a restricted modulator output signal, means for generating a first ramp signal responsive to the restricted modulator input signal and comparing the first ramp signal to a first threshold value end to a second threshold value, the first threshold value and the second threshold value with a ours width of the restricted modulator input signal, means for generating a second ramp signal responsive to the restricted modulator input signal and comparing the second ramp signal to a third threshold value associated with a pulse period of the restricted modulator input signal, means for substituting the restricted modulator output signal for the restricted modulator input signal if the first ramp signal is less than the first threshold value or if the second ramp signal is less than the third threshold value, and means for substituting an inverted restricted modulator output signal for the restricted modulator input signal if the first ramp signal is greater than the second threshold value.

* * * * *